United States Patent [19]

Ishigaki et al.

[11] 4,206,388
[45] Jun. 3, 1980

[54] CURRENT CONTROL CIRCUIT FOR HORIZONTAL DEFLECTION COIL OF TELEVISION RECEIVER

[75] Inventors: Yoshio Ishigaki, Tokyo; Tamiji Nagai, Kawasaki, both of Japan

[73] Assignee: Sony Corporation, Tokyo, Japan

[21] Appl. No.: 923,626

[22] Filed: Jul. 11, 1978

[30] Foreign Application Priority Data

Jul. 14, 1977 [JP] Japan .................................. 52-84407

[51] Int. Cl.$^2$ ............................................. H01J 29/56
[52] U.S. Cl. ..................................... 315/371; 315/408
[58] Field of Search ............... 315/370, 371, 408, 397, 315/396

[56] References Cited

U.S. PATENT DOCUMENTS

| | | | |
|---|---|---|---|
| B 483,615 | 1/1976 | Boekhorst | 315/371 |
| 3,697,801 | 10/1972 | Eulenberg | 315/371 |
| 4,063,134 | 12/1977 | Iida | 315/371 |

*Primary Examiner*—Theodore M. Blum
*Attorney, Agent, or Firm*—Lewis H. Eslinger; Alvin Sinderbrand

[57] ABSTRACT

In a circuit for controlling the current flow through a coil, such as, the horizontal deflection coil of a television receiver, a first switching circuit including a first switching transistor and a first damper diode is connected in parallel with a first resonant circuit including a first capacitor and a first coil which is the coil through which the current flow is to be controlled, a second switching circuit including a second switching transistor and a second damper diode is connected in parallel with a second resonant circuit including a second capacitor and a second coil, a charging capacitor is connected in a common current path for the first and second resonant circuits, and switching signals of the same frequency, for example, the horizontal frequency of a video signal, are applied to the first and second switching transistors with the phase difference between such signals being controlled to vary the voltage across the charging capacitor and hence the current flowing through the first coil. The phase difference between the switching signals is varied or modulated by a parabolic correcting signal having the vertical rate or frequency of a video signal in the case where a side pin-cushion distortion of the raster of a cathode ray tube is to be corrected, or the phase difference can be modulated by a correcting signal corresponding to the electron beam current or anode voltage in the cathode ray tube so as to stabilize the horizontal dimension of the raster.

23 Claims, 55 Drawing Figures

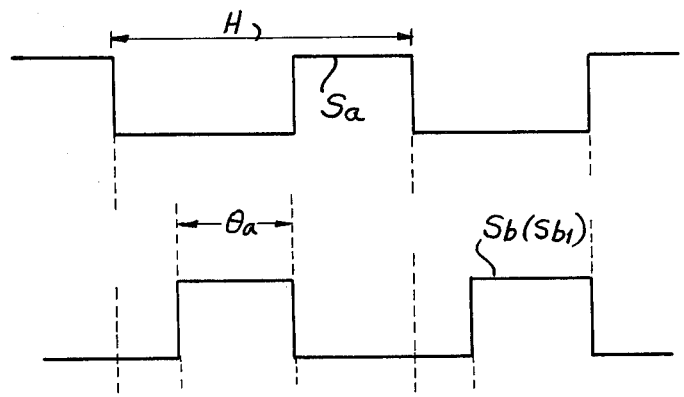
FIG.4A
FIG.4B
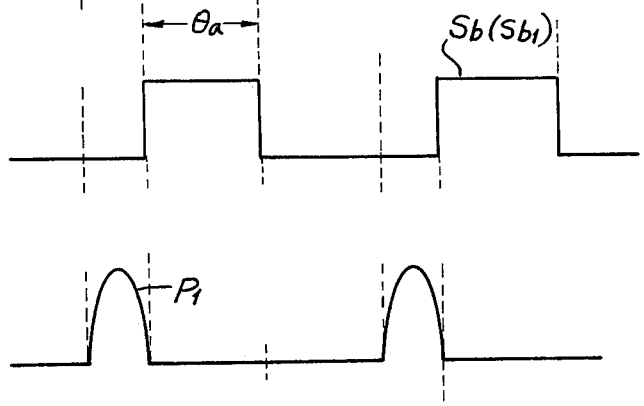
FIG.4C
FIG.4D
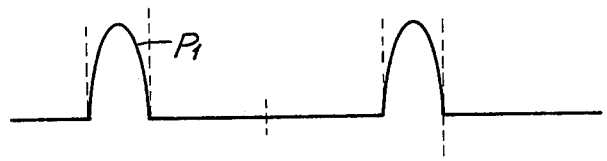
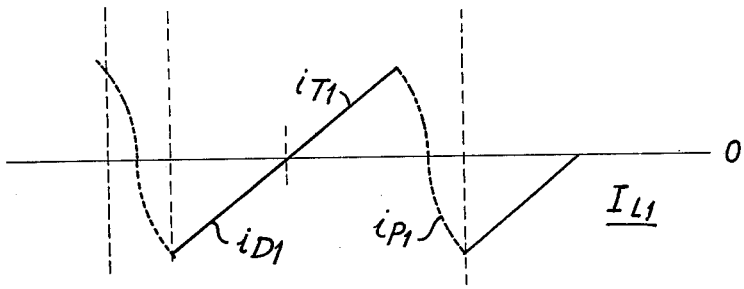
FIG.4E
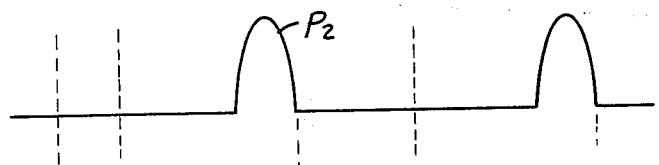
FIG.4F
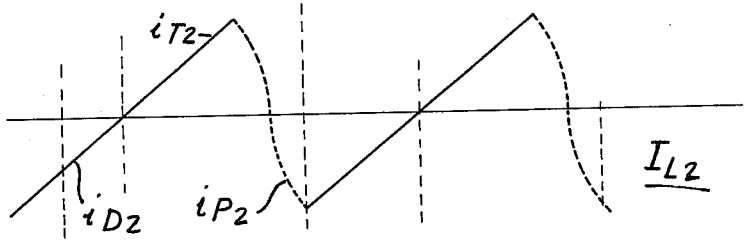

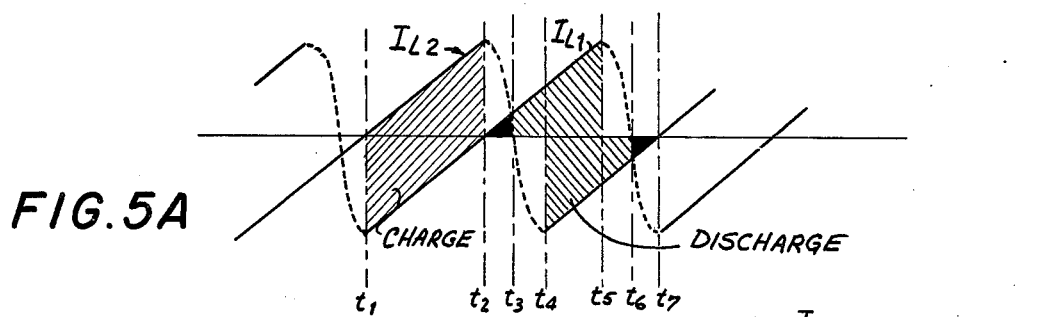
FIG.5A
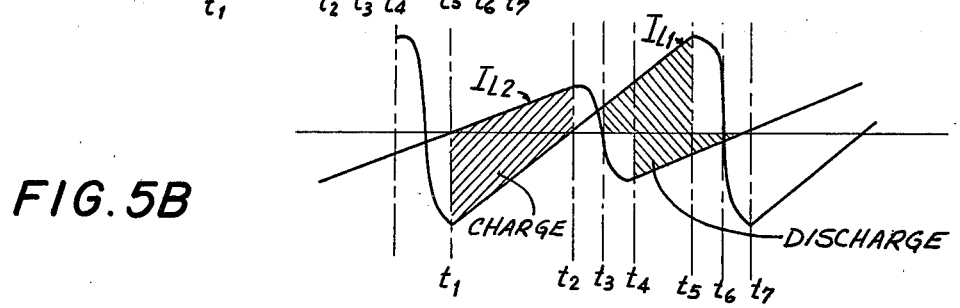
FIG.5B
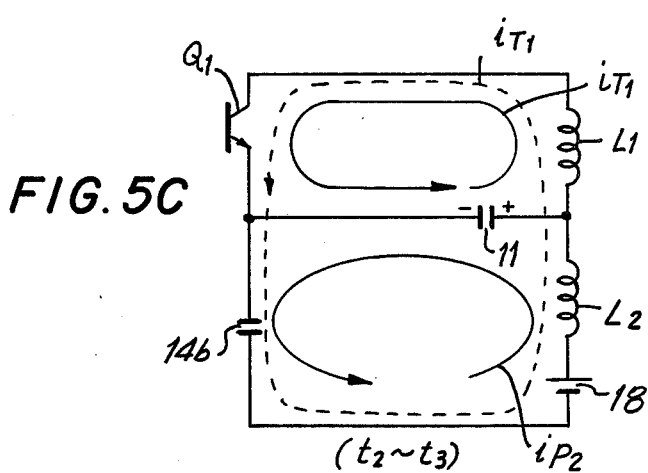
FIG.5C ($t_2 \sim t_3$)
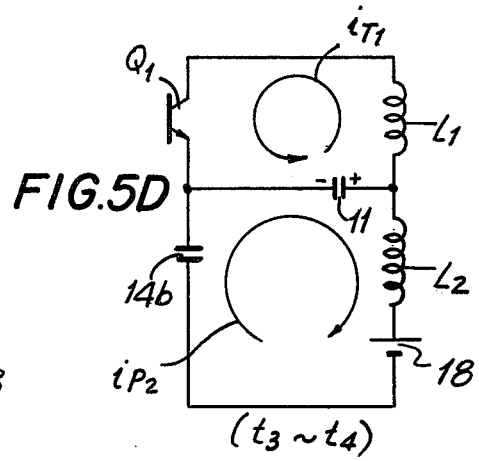
FIG.5D ($t_3 \sim t_4$)
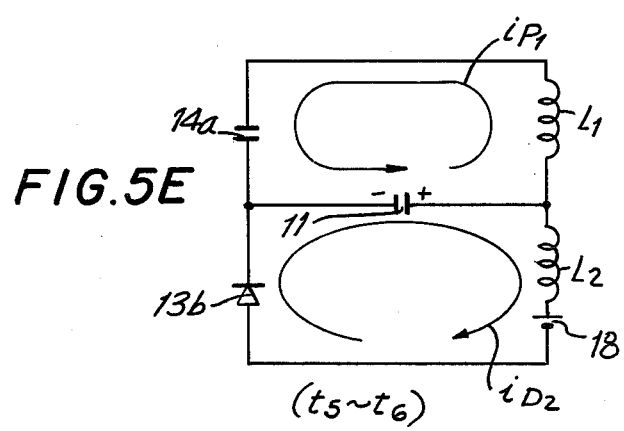
FIG.5E ($t_5 \sim t_6$)
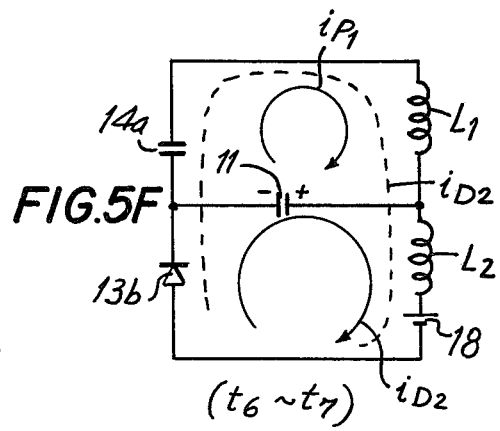
FIG.5F ($t_6 \sim t_7$)

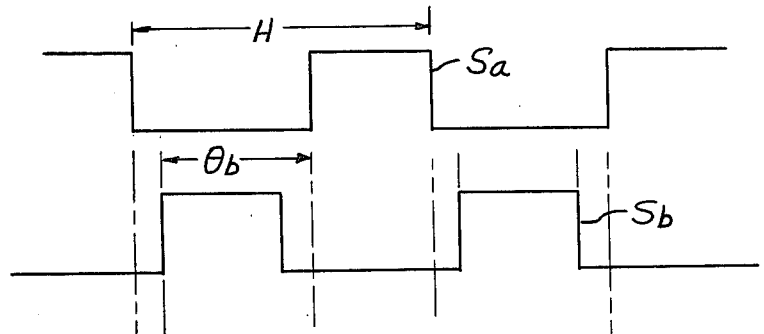
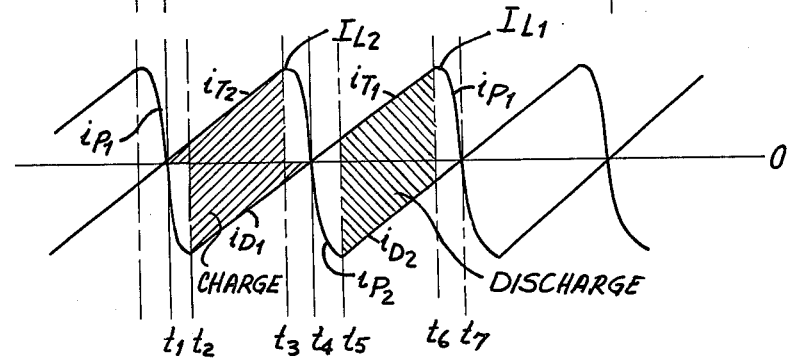
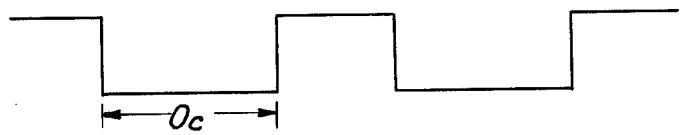
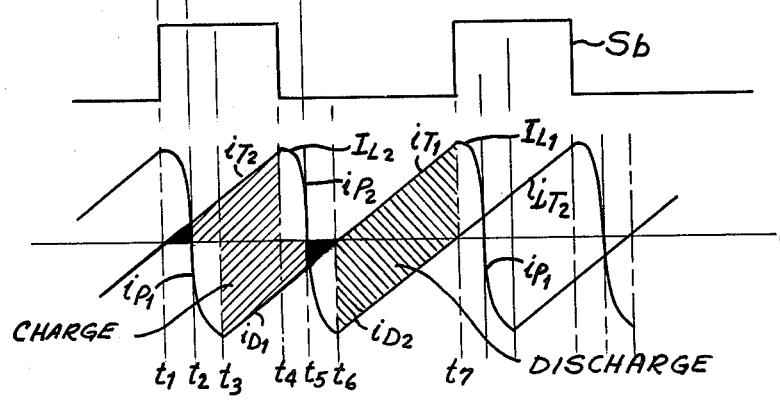
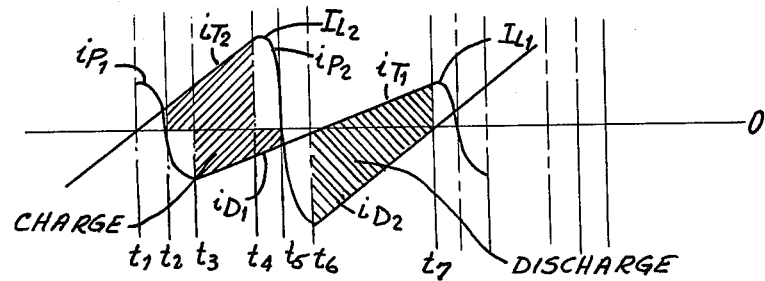

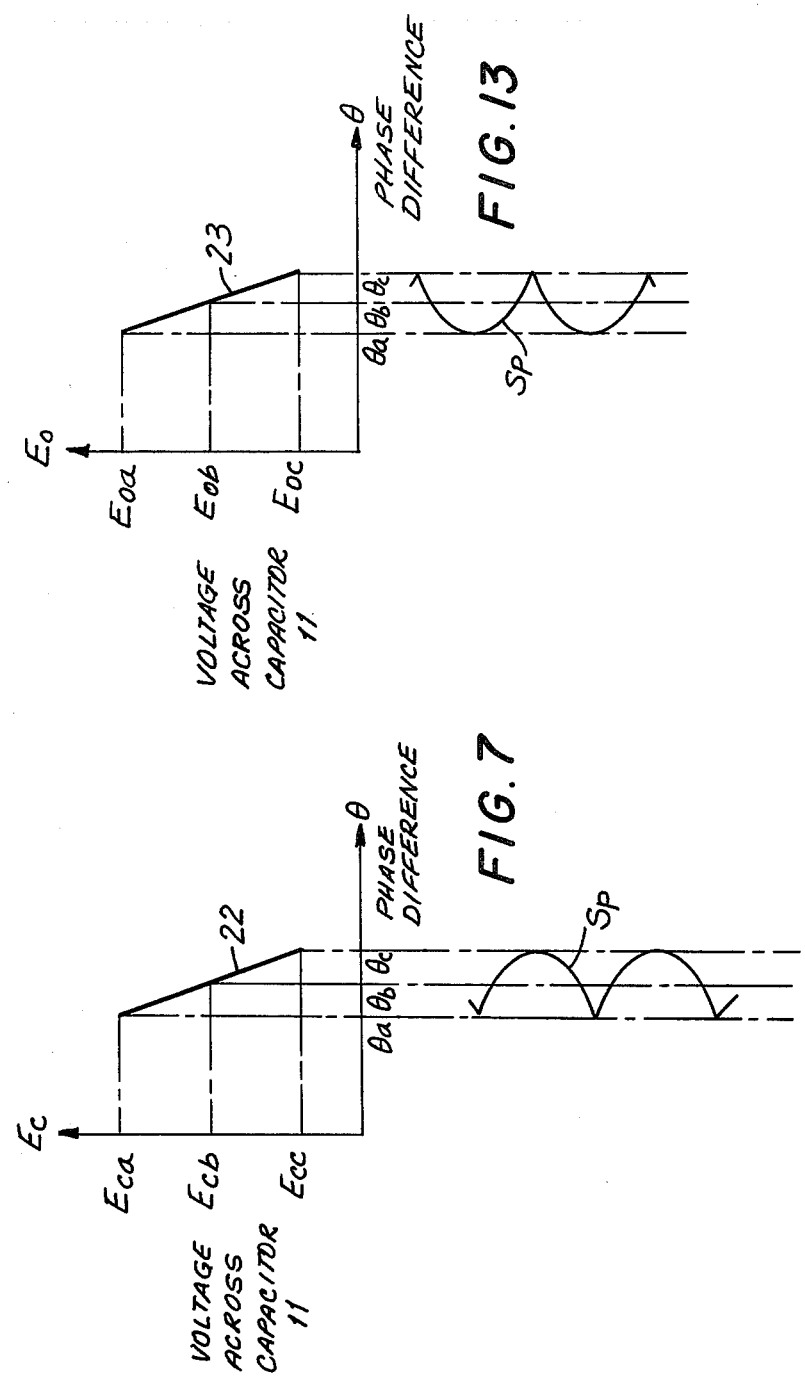

CURRENT CONTROL CIRCUIT FOR HORIZONTAL DEFLECTION COIL OF TELEVISION RECEIVER

BACKGROUND OF THE INVENTION

1. Field of the Invention

This invention relates generally to a circuit for controlling the current flow through a coil, and more particularly is directed to an improved current control circuit for the horizontal deflection coil of a television receiver.

2. Description of the Prior Art

In a television receiver, the electron beam in a cathode ray tube is electromagnetically deflected by means of a deflection yoke positioned about the neck of the cathode ray tube envelope. Deflection circuits are provided to cyclically vary currents flowing in windings of the deflection yoke so that the resulting electromagnetic fields deflect the electron beam or beams to form a raster on the face of the cathode ray tube. In most instances, it is desirable that such raster be of rectangular shape. However, various distortions occur in the scanning of the face of the cathode ray tube by the electron beam and cause deviation of the configuration of the raster from the desired rectangular shape. One form of raster distortion is the so-called side pin-cushion distortion which results primarily from the physical geometry of the deflection system. Such pin-cushion distortion is well-recognized to be undesirable, and many arrangements have been proposed to correct or compensate therefor.

An arrangement proposed to correct or compensate for the pin-cushion distortion involves modulation of the power voltage supplied to the horizontal deflection circuit of the television receiver by means of a parabolic signal having a repetition rate equal to the vertical or field frequency of a video signal so that the horizontal deflection current is modulated by such parabolic signal. Usually, a variable impedance element in the form of a transistor is connected in series with the power supply path for effecting the desired modulation of the power voltage supplied to the horizontal deflection circuit and, in such case, a relatively large power consumption or loss is experienced in the transistor. Further, if the high voltage that has to be supplied to the anode of the cathode ray tube is obtained from the secondary winding of a fly-back transformer and the power voltage is supplied to the horizontal deflection circuit through a primary winding of such fly-back transformer, the modulation of the power supply voltage by the parabolic signal varying at the vertical rate results in the high or anode voltage obtained from the secondary winding also varying parabolically at the vertical rate so that a constant voltage cannot be obtained. The resulting variation in the anode voltage causes a corresponding change or variation in the brightness of the picture displayed on the cathode ray tube screen. Therefore, in order to obtain a constant high or anode voltage, it has been necessary to provide a high voltage generating circuit independent of the horizontal deflection circuit in the case where the above described arrangement is employed to correct for side pin-cushion distortion.

In another arrangement provided for dynamically correcting for side pin-cushion distortion, a saturable reactor is connected in series with the horizontal deflection coil or winding, and the reactance or inductance of the saturable reactor is modulated by the parabolic signal at the vertical rate so that the horizontal deflection current is modulated by such parabolic signal. However, due mostly to the characteristic of the saturable reactor, the linearity of the horizontal deflection current flowing through the horizontal deflection coil is deteriorated. Further, if the high or anode voltage is obtained from the secondary winding of the fly-back transformer which has its primary winding connected in series with the power supply path to the horizontal deflection circuit, variation of the inductance determining the retrace resonant frequency and, therefore, variation of the pulse width of the fly-back pulse, causes the high voltage obtained from the secondary winding of the fly-back transformer to vary parabolically at the vertical rate, as in the first described arrangement according to the prior art.

OBJECTS AND SUMMARY OF THE INVENTION

Accordingly, it is an object of this invention to provide an improved circuit for controlling the current flow through a coil and which avoids the above described disadvantages of the prior art.

More particularly, it is an object of this invention to provide an improved circuit for controlling the current flow through the horizontal deflection coil of a television receiver or the like.

Another object is to provide an improved circuit for controlling the current flow through the horizontal deflection coil of a television receiver so as to correct or compensate for the so-called side pin-cusion distortion of the raster.

Still another object is to provide an improved current control circuit for the horizontal deflection coil, as aforesaid, in which the linearity of the horizontal deflection current is not deteriorated.

Still another object is to provide an improved side pin-cushion distortion correcting circuit which entails only a relatively small power loss.

A further object of the invention is to provide an improved side pin-cusion distortion correcting circuit which permits a high voltage, such as is required for application to the anode of a cathode ray tube, to be obtained from the horizontal deflection circuit without being affected by the parabolic signal employed for correcting the pin-cusion distortion.

A still further object of the invention is to provide an improved current control circuit by which the size of the raster, in the horizontal direction, is stabilized or made constant notwithstanding the fact that variations occur in the electron beam current or in the anode voltage of the cathode ray tube.

In accordance with an aspect of this invention, in a circuit for controlling the current flow through a coil, such as, the horizontal deflection coil of a television receiver, a first switching circuit including a first switching transistor and a first damper diode is connected in parallel with a first resonant circuit including a first capacitor and the coil through which the current flow is to be controlled, a second switching circuit including a second switching transistor and a second damper diode is connected in parallel with a second resonant circuit including a second capacitor and a second coil, a charging capacitor is connected in a common current path for the first and second switching circuits, and first and second switching signals of the same frequency, for example, the horizontal frequency of a video signal, are applied to the first and second switching transistors, respectively, with the phase difference between such switching signals being controlled to vary the voltage across the charging capacitor and hence the current flowing through the first mentioned coil.

In one embodiment of the invention, the phase difference between the first and second switching signals is varied or modulated by a parabolic correcting signal having the vertical rate or frequency of a video signal so that the horizontal deflection current flowing through the horizontal deflection coil is modulated parabolically at the vertical rate for correcting the side pin-cushion distortion. In another embodiment of the invention, the phase difference between the first and second switching signals is modulated or varied by a signal varying in correspondence with the beam current or anode voltage in the cathode ray tube so that the size of the raster in the horizontal direction is stabilized regardless of changes in the electron beam current or in the anode voltage.

The above, and other objects, features and advantages of the invention, will be apparent in the following detailed description of illustrative embodiments thereof which is to be read in connection with the accompanying drawings.

BRIEF DESCRIPTION OF THE DRAWINGS

FIGS. 4A-4F are waveform diagrams to which reference will be made in explaining the operation of the circuit of FIG. 2;

FIGS. 5A and 5B are further waveform diagrams to which reference will be made in explaining the operation of the current control circuit according to this invention, and FIGS. 5C-5F are additional equivalent circuits to which reference will be made in explaining the invention;

FIGS. 6A-6G are additional waveform diagrams to which reference will be made in explaining the operation of the control circuit of FIG. 2 for other phase relationships of the switching signals;

FIG. 7 is a graphic illustration of the dependence between the phase relationship of the switching signals and the voltage across a charging capacitor included in the control circuit of FIG. 2;

FIG. 13 is a graphic illustration similar to the of FIG. 7, but showing the respective relationship for the preferred embodiment of the invention;

DETAILED DESCRIPTION OF THE PREFERRED EMBODIMENTS

Figure 1:
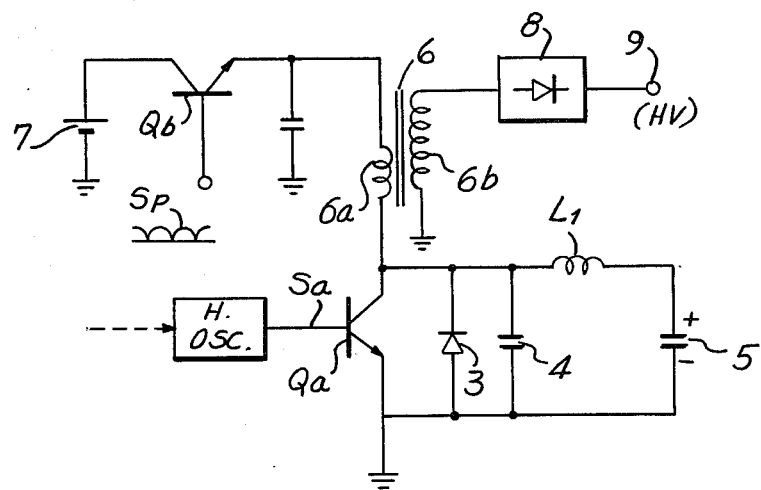
FIG. 1 is a circuit diagram illustrating a horizontal deflection circuit of a television receiver with an arrangement to correct for side pin-cushion distortion according to the prior art.

Referring initially to FIG. 1, it will be seen that, in an existing circuit for correcting side pin-cushion distortion of the raster in a television receiver, an oscillator 1 generates a drive pulse or signal $S_a$ at the horizontal or line frequency of a television signal. The drive signal $S_a$ is applied to the base of a switching transistor $Q_a$ in a horizontal deflection circuit which further includes a horizontal deflection coil $L_1$, a damper diode 3, a resonant capacitor 4 and an S-shaping capacitor 5. A DC power supply voltage is supplied from a source 7 to horizontal deflection coil $L_1$ through a coil $6a$ which is the primary winding of a fly-back transformer 6, and a control transistor $Q_b$ acting as a variable impedance has its collector-emitter circuit interposed, in series, in the power supply path. A parabolic correcting signal $S_p$ having a repetition rate equal to the vertical deflection rate or frequency of the television signal is applied to the base of control transistor $Q_b$ so that the power supply voltage is modulated by correcting signal $S_p$ and the horizontal deflection current flowing through coil $L_1$ is subjected to a similar parabolic modulation at the vertical rate for correcting the side pin-cushion distortion of the raster.

Although the above described arrangement according to the prior art is effective to correct the side pin-cushion distortion of the raster, it will be appreciated that a relatively large power loss occurs in control transistor $Q_b$ due to the fact that such control transistor is employed as a variable impedance element interposed in series in the power supply path for modulating the supply voltage. Further, if a high voltage pulse obtained from a secondary winding $6b$ of fly-back transformer 6 is rectified by a rectifying circuit 8 to provide a high voltage HV at an output terminal 9, for example, for application to the anode of the cathode ray tube in the television receiver, such high voltage HV varies parabolically at the vertical rate because the power voltage supplied to primary winding $6a$ of the fly-back transformer is modulated by the correcting signal $S_p$. Therefore, a constant high voltage cannot be obtained from secondary winding $6b$ of fly-back transformer 6 with the horizontal deflection circuit according to the prior art, as shown on FIG. 1.

Figure 2:
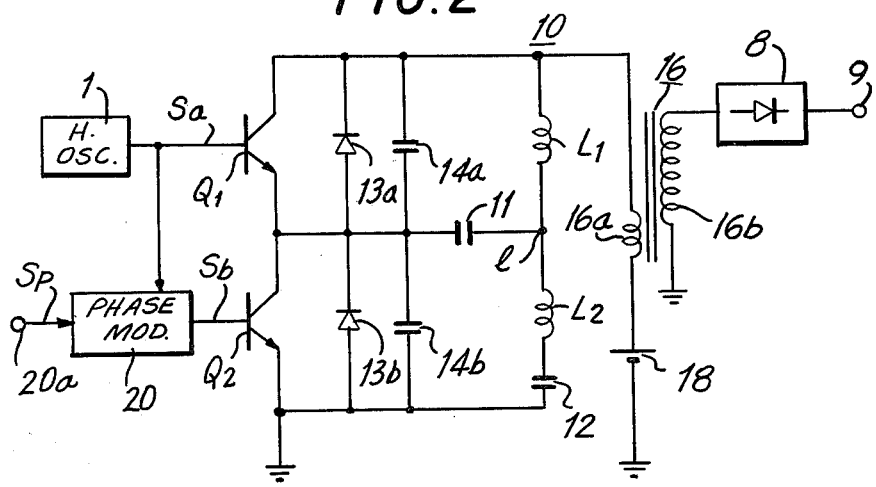
FIG. 2 is a circuit diagram showing the essential elements of a current control circuit according to an embodiment of the present invention used in connection with a horizontal deflection circuit of a television receiver.

Referring now to FIG. 2, it will be seen that, in the application of the present invention to a pin-cushion distortion correcting circuit 10 for a television receiver, first and second coils $L_1$ and $L_2$ and a capacitor 12 are connected in a series circuit. First and second switching transistors $Q_1$ and $Q_2$ are connected in series with each other and in parallel with first and second damper diodes $13a$ and $13b$, respectively. The damper diodes $13a$ and $13b$ are further shown to be connected in series with each other and in parallel with first and second resonant capacitors 14a and 14b, respectively, with such capacitors 14a and 14b being connected in series with each other. A connection point 1 between coils $l_1$ and $l_2$ is shown to be connected through a charging capacitor 11 with a connection point between the emitter of switching transistor $Q_1$ and the collector of switching transistor $Q_2$. The emitter of switching transistor $Q_2$ and the plate of capacitor 12 remote from coil $L_2$ are connected to ground. A power voltage supply source 18 is connected through a primary winding 16a of a fly-back transformer 16 to the collector of transistor $Q_1$ and the coil $L_1$ which is the horizontal deflection coil of a television receiver and corresponds to the coil $L_1$ on FIG. 1. The fly-back transformer 16 is further shown to have a secondary winding 16b which is connected to a rectifying circuit 8 so as to obtain a high voltage at an output terminal 9. Further, in the circuit of FIG. 2, the horizontal drive pulse $S_a$ from horizontal oscillator 1 is applied to the base of first switching transistor $Q_1$ and also to a phase modulation circuit 20 in which the phase of drive pulse $S_a$ is modulated by the parabolic correcting signal $S_p$ which is repeated at the vertical rate. The resulting output $S_b$ of phase modulation circuit 20 is applied to the base of the second switching transistor $Q_2$. Thus, switching transistors $Q_1$ and $Q_2$ are switched by the switching signals or pulses $S_a$ and $S_b$ which have the same frequency (the horizontal deflection frequency of the video signal) and different phases, with the phase difference between signals $S_a$ and $S_b$ being controlled by the correcting signal $S_p$.

Figure 3A:
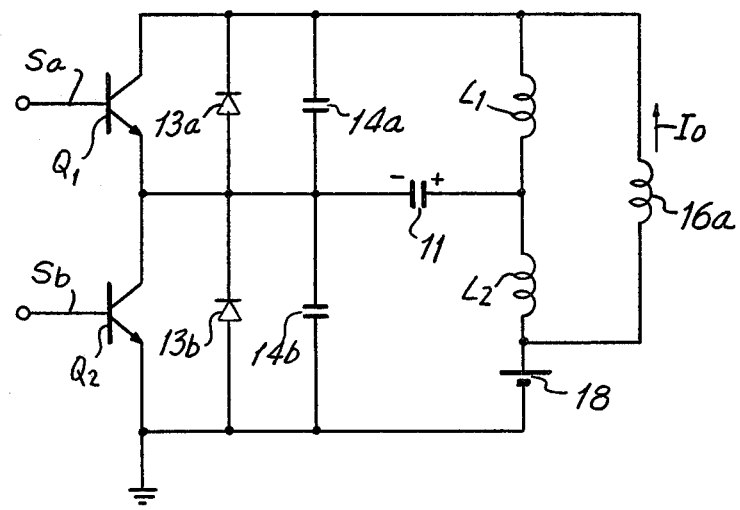
FIGS. 3A and 3B illustrate simplified circuits that are equivalent to the circuit shown on FIG. 2.

Since the end of primary winding 16a connected to power voltage supply source 18 and the plate of capacitor 12 connected to coil $L_2$ can be considered to be at the same potential in respect to DC, that is, the power supply voltage of source 18, such points in the circuit shown on FIG. 2 can be drawn as being connected together, as in the simplified equivalent circuit of FIG. 3A. The equivalent circuit of FIG. 3A can be further simplified to the equivalent circuit of FIG. 3B in which currents flowing through coils $L_1$ and $L_2$ will correspond to the currents flowing through such coils in the circuit configuration of FIG. 2. Therefore, the operation of the side pin-cushion distortion correcting circuit of FIG. 2 is hereinafter described with reference to the equivalent circuit of FIG. 3B.

The switching signals $S_a$ and $S_b$ applied to the bases of switching transistors $Q_1$ and $Q_2$, respectively, are assumed to be rectangular wave signals having the horizontal rate or frequency of the video signal, with the phase difference between the switching signals $S_a$ and $S_b$ being $\theta$ at a predetermined time in each vertical interval of the video signals, as shown on FIGS. 4A and 4B. Each time switching transistor $Q_1$ is made non-conductive or turned OFF at the trailing or down-going edge of switching signal $S_a$, a voltage pulse $P_1$ (FIG. 4C) appears across deflection coil L. By reason of the voltage pulses $P_1$, a current $L_{L1}$ (FIG. 4D) is made to flow through deflection coil $L_1$. The position portions of the current waveform shown on FIG. 4D correspond to the current direction represented by the arrow $I_{L1}$ on FIG. 3B and which flows mainly through the switching transistor $Q_1$. The current waveform of FIG. 4D is shown to include a portion $i_{T1}$ representing the current flowing through switching transistor $Q_1$, and a portion $i_{D1}$ representing a damper current which, as indicated on FIG. 3B, flows in a direction opposite to that of the current $i_{T1}$ flowing through transistor $Q_1$. The portion of the waveform represented by the broken line on FIG. 4D represents a resonant current $i_{P1}$ flowing in the closed loop of deflection coil $L_1$ and resonant capacitor 14a when switching transistor $Q_1$ is made non-conductive. As is well-known, in the absence of damper diode 13a, the resonant current $i_{P1}$ would continue to flow as a ringing current. However, because of the conductivity of damper diode 13a, resonant current $i_{P1}$ exists only for a half cycle and, therefore, is replaced by a damper current $i_{D1}$.

Similarly, whenever switching transistor $Q_2$ is made non-conductive or turned OFF by each trailing or downgoing edge of switching signal $S_b$, a voltage pulse $P_2$ (FIG. 4E) appears across second coil $L_2$ and, as a result thereof, a current $I_{L2}$ (FIG. 4F) having a waveform similar to that of the current $I_{L1}$ flows through coil $L_2$. Thus, the waveform of current $I_{L2}$ (FIG. 4F) is shown to include portions representing a transistor current $i_{T2}$, a damper current $i_{D2}$ and a resonant current $i_{P2}$.

The affects of currents $I_{L1}$ and $I_{L2}$ flowing through deflection coil $L_1$ and coil $L_2$, respectively on the charge of capacitor 11 will now be considered with reference to FIG. 5A in which the waveforms of the currents $I_{L1}$ and $I_{L2}$ (FIGS. 4D and 4F) are superposed on each other. It will be seen that, in the period or time interval from $t_1$ to $t_2$, damper current $i_{D1}$ flows through coil $L_1$ and transistor current $i_{T2}$ flows through the coil $L_2$. Both of these currents $i_{D1}$ and $i_{T2}$ flow through capacitor 11 in the direction to charge the latter, assuming the polarity indicated on FIG. 3B. Therefore, during the period $t_1$ to $t_2$, capacitor 11 is charged by both currents $I_{L1}$ and $I_{L2}$, and the charged voltage across capacitor 11 during such period $t_1$ to $t_2$ is proportional to the hatched area therebetween on FIG. 5A, that is, to the integrated value of the current flowing through capacitor 11 in the period $t_1$ to $t_2$.

Figure 3B:
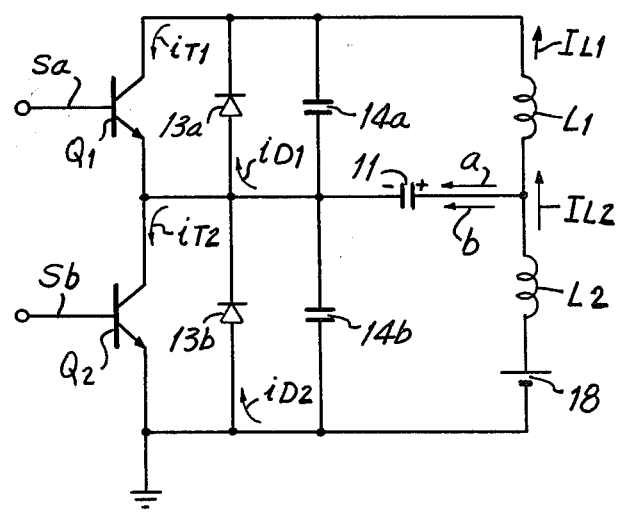

In the next period from $t_2$ to $t_3$, the current flowing through coil $L_1$ is the transistor current $i_{T1}$ since switching transistor $Q_1$ is made conductive or turned ON at a time $t_2$, and the current flowing through coil $L_2$ is the resonant current $i_{P2}$ flowing in the direction represented by the arrow b on FIG. 3B. Thus, in the period $t_2$ to $t_3$, the circuit of FIG. 3B can be redrawn as shown on FIG. 5C for consideration of the currents flowing through coils $L_1$ and $L_2$. As is clear from FIG. 5C, the currents $i_{T1}$ and $i_{P2}$ flow in opposite directions in respect to capacitor 11, with the current $i_{P2}$ being larger than the current $i_{T1}$ in the period $t_2$ to $t_3$, as shown on FIG. 5A. Therefore, a resultant or difference current $(i_{P2}-i_{T1})$ flows through capacitor 11 in the direction of the current $i_{P2}$. Although the currents $i_{T1}$ and $i_{P2}$ are both represented by solid lines on FIG. 5C as flowing through capacitor 11, in actual fact only the difference current $(i_{P2}-i_{T1})$ flows through capacitor 11, and the transistor current $i_{T1}$ flows through capacitor 14b as represented by the broken line on FIG. 5C.

It will be appreciated that the difference current $(i_{P2}-i_{T1})$ flows wholly through capacitor 14b and coil $L_2$. Since capacitor 11 has a capacitance value much larger than that of capacitor 14b, the impedance of capacitor 11 is much smaller than that of capacitor 14b. Therefore, the charged voltage of capacitor 11 by reason of the current $(i_{P2}-i_{T1})$ is much smaller than the charged voltage across capacitor 14b. In other words, the charged voltage across capacitor 11 during the period $t_2$ to $t_3$ can be considered to be unchanged.

During the next period from $t_3$ to $t_4$, the current flowing through coil $L_1$ is still the transistor current $i_{T1}$ and the current flowing through coil $L_2$ is the resonant current $i_{P2}$ flowing in the direction opposed to that of the resonant current $i_{P2}$ during the earlier period $t_2$ to $t_3$. Therefore, for the purpose of considering the currents flowing through coils $L_1$ and $L_2$ during the period $t_3$ to $t_4$, the circuit of FIG. 3B can be further simplified or drawn as shown on FIG. 5D, in which the currents $i_{T1}$ and $i_{P2}$ are shown to flow through capacitor 11 in the same direction which is the discharging direction. Therefore, in the period $t_3$ to $t_4$, the currents $i_{T1}$ and $i_{P2}$ do not tend to cancel each other and may be considered to both flow through capacitor 11, as represented by the solid arrows on FIG. 5D. In this case, capacitor 11 is discharged by the current $i_{T1}$, but the current $i_{P2}$ does not act to discharge capacitor 11 by reason of the previously mentioned fact that the capacitance value of capacitor 11 is much larger than that of capacitor 14b. Thus, in the period between the times $t_3$ and $t_4$, the discharged voltage of capacitor 11 is proportional to the hatched area indicated between such times on FIG. 5A.

During the next period from $t_4$ to $t_5$, the transistor current $i_{T1}$ continues to flow through coil $L_1$, and the current flowing through coil $L_2$ is the damper current $i_{D2}$ because the damper diode 13b is turned ON by the voltage across resonant capacitor 14b. The currents $i_{T1}$ and $i_{D2}$ both flow through capacitor 11 in the same direction to discharge the latter. Therefore, in the period between the times $t_4$ and $t_5$, capacitor 11 is discharged by a voltage proportional to the hatched area between such times on FIG. 5A.

During the next period $t_5$ to $t_6$, the current flowing through coil $L_1$ is the resonant current $i_{P1}$ because transistor $Q_1$ is made non-conductive or turned OFF at the time $t_5$, and the current flowing through coil $L_2$ during the period $t_5$ to $t_6$ is still the damper current $i_{D2}$. As is indicated on FIG. 5E, during the period $t_5$ to $t_6$, the resonant current $i_{P1}$ flows in the same direction as the direction of the transistor current $i_{T1}$ so that both currents $i_{P1}$ and $i_{D2}$ flow through capacitor 11 in the same direction to discharge capacitor 11. However, since the capacitance value of capacitor 11 is much larger than that of capacitor 14a, capacitor 11 is discharged only by the damper current $i_{D2}$ and, therefore, the discharged voltage of capacitor 11 is proportional to the hatched area appearing on FIG. 5A between the times $t_5$ and $t_6$.

During the final period of the cycle, that is, from $t_6$ to $t_7$, the current flowing through coil $L_1$ continues to be the resonant current $i_{P1}$ which has undergone a reversal of its direction from that during the period $t_5$ to $t_6$, and the current flowing through coil $L_2$ is still the damper current $i_{D2}$. Thus, as shown on FIG. 5F, the currents $i_{P1}$ and $i_{D2}$ flow in opposite directions in respect to capacitor 11 and, as is clear from FIG. 5A, the current $i_{P1}$ is larger than the current $i_{D2}$ during the period $t_6$ to $t_7$. Therefore, the difference current $(i_{P1} - i_{D2})$ flows through capacitor 11 in the direction to charge the same. In actual fact, the damper current $i_{D2}$ does not flow through capacitor 11 but rather through the resonant capacitor 14a, as indicated by the broken line on FIG. 5F. The current actually flowing through capacitor 11 in the time period $t_6$ to $t_7$ is only a portion of the resonant current $i_{P1}$ flowing through resonant capacitor 14a, and the charged voltage of capacitor 11 by reason of such portion of resonant current $i_{P1}$ is almost negligible. Therefore, during the period $t_6$ to $t_7$, the voltage across capacitor 11 can be considered unchanged.

If the phase difference $\theta a$ between switching signals $S_a$ and $S_b$ is maintained, the foregoing operations will be repeated cyclically in successive time periods $t_1$ to $t_7$. In each cycle, capacitor 11 is charged during the period $t_1$ to $t_2$ and is discharged during the periods $t_3$ to $t_4$, $t_4$ to $t_5$ and $t_5$ to $t_6$. As is apparent from FIG. 5A, if capacitor 11 was also discharged during each of the periods $t_2$ to $t_3$ and $t_6$ to $t_7$, as represented by the respective shaded areas on FIG. 5A, the charged and discharged voltages of capacitor 11 during each operating cycle would be equal. However, the capacitor 11 is not actually discharged during the periods $t_2$ to $t_3$ and $t_6$ to $t_7$ so that the charged voltage is larger than the discharged voltage for each complete cycle by a voltage proportional to the shaded areas between the times $t_2$ and $t_3$ and the times $t_6$ and $t_7$ on FIG. 5A. Due to such voltage difference between the charged voltage and the discharged voltage of capacitor 11, the voltage across capacitor 11 is increased from the initial voltage $E/2$ (in which E is the DC power supply voltage of source 18).

In the initial condition, that is, when the voltage across capacitor 11 is $E/2$, the peak values of the currents flowing through coils $L_1$ and $L_2$ are equal if coils $L_1$ and $L_2$ have equal inductance values. The foregoing results from the fact that the supply voltage for the switching circuit which includes the coil $L_1$ and transistor $Q_1$ is the voltage across capacitor 11, namely, $E/2$, while the supply voltage for the other switching circuit including the coil $L_2$ and switching transistor $Q_2$ is the voltage difference between the voltage of source 18 and the voltage across capacitor 11, namely, the supply voltage $(E - E/2)$ or $E/2$. In other words, assuming that coils $L_1$ and $L_2$ have equal inductance values, in the initial condition in which the voltage across capacitor 11 is $E/2$, the peak values of the currents $I_{L1}$ and $I_{L2}$ flowing through coils $L_1$ and $L_2$ are equal by reason of the fact that the supply voltages for the two switching circuits are also equal.

When the phase difference between switching signals $S_a$ and $S_b$ is $\theta a$ with the result that the voltage across capacitor 11 becomes larger than $E/2$, for example, the voltage across capacitor 11 becomes $E/2 + \alpha$, in which $\alpha$ is a positive voltage proportional to the shaded area between the times $t_2$ and $t_3$ and the times $t_6$ and $t_7$ on FIG. 5A, the supply voltage for the switching circuit including transistor $Q_1$ becomes $E/2 + \alpha$ and the supply voltage for the other switching circuit including switching transistor $Q_2$ becomes $E/2 - \alpha$. Therefore, as is shown on FIG. 5B, the peak values of the currents $I_{L1}$ and $I_{L2}$ become unequal, that is, the peak value of the current $I_{L1}$ increases and the peak value of the current $I_{L2}$ decreases to cause the charged voltage and the discharged voltage of each cycle to become equal and, thereby, to stabilize the voltage across capacitor 11 at $E/2 + \alpha$. In other words, when the phase difference between switching signals $S_a$ and $S_b$ is $\theta a$, as shown on FIGS. 4A and 4B, the voltage across capacitor 11 increases by the value $\alpha$ from the initial voltage $E/2$, and the current flowing through coil $L_1$, that is, the horizontal deflection coil, increases by an amount corresponding to the voltage increase $\alpha$.

The operation of the circuit according to this invention as shown on FIG. 2 and, in simplified form, on FIG. 3B, will now be considered for the case where the phase difference between switching signals $S_a$ and $S_b$ is increased to the value $\theta_b$ ($\theta_b$ is greater than $\theta_a$) as shown on FIGS. 6A and 6B. As before, the currents $I_{L1}$ and $I_{L2}$ (FIG. 6C) are made to flow through the coils $L_1$ and $L_2$ in response to the switching signals $S_a$ and $S_b$, respectively. More particularly, and as shown on FIG. 6C, the capacitor 11 is charged by the currents $I_{L1}$ and $I_{L2}$ during the period $t_1$ to $t_4$ and the charged voltage of capacitor 11 is proportional to the hatched area appearing on FIG. 6C between the times $t_1$ and $t_4$. During the following period $t_4$ to $t_7$, capacitor 11 is discharged by currents $I_{L1}$ and $I_{L2}$, with the discharged voltage of capacitor 11 being proportional to the hatched area appearing between the times $t_4$ and $t_7$ on FIG. 6C. As will be seen from FIG. 6C, the hatched areas representing the charged voltage and the discharged voltage, respectively, of capacitor 11 are equal when the phase difference between switching signals $S_a$ and $S_b$ is $\theta_b$, so that the voltage across capacitor 11 is unchanged and the peak values of currents $I_{L1}$ and $I_{L2}$ are equal. Therefore, when the phase difference is $\theta_b$, as shown on FIGS. 6A and 6B, the voltage across capacitor 11 is maintained at the initial voltage value $E/2$, and the current $I_{L1}$ flowing through coil $L_1$, that is, the horizontal deflection coil is unchanged.

When the phase difference between switching signals $S_a$ and $S_b$ is further increased from $\theta_b$ to $\theta_c$, as shown on FIGS. 6D and 6E, the switching signals $S_a$ and $S_b$ cause currents $I_{L1}$ and $I_{L2}$ to flow through coils $L_1$ and $L_2$, respectively, as shown on FIG. 6F. During the period $t_1$ to $t_2$, the transistor current $i_{T2}$ and the resonant current $i_{P1}$ flow in opposite directions in respect to capacitor 11 with the current $i_{P1}$ being larger than the current $i_{T2}$, so that the transistor current $i_{T2}$ does not, in fact, flow through capacitor 11 and only a part of the resonant current $i_{P1}$ flows through capacitor 11. Therefore, during the period $t_1$ to $t_2$, the voltage across capacitor 11 is substantially unchanged. During the next period $t_2$ to $t_5$, capacitor 11 is charged by the currents $I_{L1}$ and $I_{L2}$, and the charged voltage of capacitor 11 is proportional to the hatched area appearing on FIG. 6F between the times $t_2$ and $t_5$. During the next period $t_5$ to $t_6$, the transistor current $i_{T1}$ and the resonant current $i_{P2}$ flow in opposite directions in respect to capacitor 11 with the current $i_{P2}$ being larger than the current $i_{T1}$. Therefore, the transistor current $i_{T1}$ does not, in fact, flow through capacitor 11 and only a part of the resonant current $i_{P2}$ flows through capacitor 11. By reason of the foregoing, during the period $t_5$ to $t_6$, the voltage across capacitor 11 is substantially unchanged. During the final period $t_6$ to $t_7$, capacitor 11 is discharged by the transistor current $i_{T1}$ and the damper current $i_{D2}$, and the discharged voltage during this period is proportional to the hatched area shown on FIG. 6F between the times $t_6$ and $t_7$. As is apparent from FIG. 6F, during each complete cycle of operation of the circuit, that is, during each horizontal interval extending from $t_1$ to $t_7$, the discharge voltage of capacitor 11 is larger than the charged voltage by the value proportional to the shaded areas between the times $t_1$ and $t_2$ and the times $t_5$ and $t_6$. Thus, the voltage across capacitor 11 is decreased from the initial voltage $E/2$ by the voltage difference between the charged and discharged voltages. Accordingly, the supply voltage for the switching circuit including coil $L_1$ and transistor $Q_1$ becomes $E/2 - \alpha$ and the supply voltage for the switching circuit including the coil $L_2$ and transistor $Q_2$ becomes $E/2 + \alpha$. Therefore, the current $I_{L1}$ flowing through the horizontal deflection coil $L_1$ decreases from an initial current value by an amount corresponding to the voltage difference $\alpha$ and the current $I_{L2}$ flowing through the coil $L_2$ increases correspondingly, as shown on FIG. 6G. The decrease of the peak value of the current $I_{L1}$ and the increase of the peak value of the current $I_{L2}$ are such, as shown on FIG. 6G, that the charged and discharged voltages of capacitor 11 become equal. Therefore, when the phase difference between switching signals $S_a$ and $S_b$ is $\theta_c$, as shown on FIGS. 6D and 6E, the voltage across capacitor 11 decreases by the value $\alpha$ and the current flowing through the horizontal deflection coil $L_1$ is decreased from the initial value.

Although the operation of the circuit shown on FIG. 2 has been described above for the condition in which the phase difference between switching signals $S_a$ and $S_b$ is $\theta_b$ and the voltage across capacitor 11 is unchanged, and for the conditions in which the phase difference between switching signals $S_a$ and $S_b$ is either decreased to $\theta_a$ or increased to $\theta_c$ so as to either increase or decrease, respectively, the voltage across capacitor 11, it will be appreciated that, for phase differences between $\theta_b$ and $\theta_a$, the voltage across capacitor 11 increases from the initial voltage with the amount of such voltage increase being proportional to the amount of decrease of the phase difference from the value $\theta_b$. In other words, and as indicated by the line 22 on FIG. 7, the voltage across capacitor 11 increases progressively from the voltage $E_{cb}$ (which corresponds to the initial voltage $E/2$) for the phase difference $\theta_b$ to the voltage $E_{ca}$ for the phase difference $\theta_a$ as the phase difference between switching signals $S_a$ and $S_b$ decreases progressively from the value $\theta_b$ to the value $\theta_a$. Similarly, as the phase difference is increased from the value $\theta_b$ to the value $\theta_c$, the voltage across capacitor 11 decreases progressively from the initial value $E_{cb}$ to the minimum value $E_{cc}$. As will be appreciated from FIG. 7, if the phase difference between switching signals $S_a$ and $S_b$ is modulated by the correcting signal $S_P$ which has a parabolic waveform with a repetition rate equal to the vertical frequency of the video signal, the voltage $E_c$ across capacitor 11 will be similarly modulated by the correcting signal $S_p$. In modulating the phase difference between switching signals $S_a$ and $S_b$, the phase of the switching signal $S_a$ may be fixed, while the phase of the switching signal $S_b$ is modulated by the correcting signal $S_p$, as on FIG. 2.

Figure 8A:
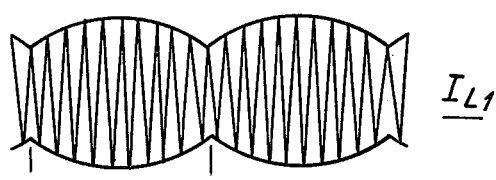
FIGS. 8A and 8B are waveform diagrams illustrating currents flowing through coils of the circuit shown on FIG. 2.
Figure 8B:
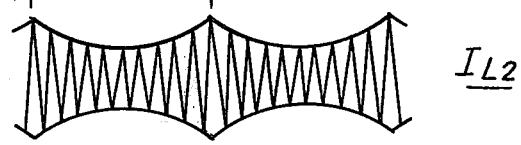

In the case where the coil $L_1$ is the horizontal deflection coil of a television receiver, as described above with reference to FIG. 2, the current $I_{L1}$ flowing through coil $L_1$ is the horizontal deflection current and is proportional to the voltage $E_c$ across capacitor 11 by reason of the fact that the supply voltage for the switching circuit including the horizontal deflection coil $L_1$ is the voltage across capacitor 11. Therefore, the horizontal deflection current $I_{L1}$ is modulated by the correcting signal $S_p$ when the phase difference between switching signals $S_a$ and $S_b$ is modulated by the correcting signal $S_p$. The waveform of the horizontal deflection current $I_{L1}$ is shown on FIG. 8A for the case where the phase difference between switching signals $S_a$ and $S_b$ is modulated between $\theta_a$ and $\theta_c$ by the correcting signal $S_p$ having a parabolic waveform which is repeated at the vertical rate. The waveform of the corresponding current $I_{L2}$ flowing through the coil $L_2$ is shown on FIG. 8B. It is believed to be apparent from the foregoing that the circuit shown on FIG. 2, in providing the horizontal deflection current $I_{L1}$ with the waveform shown on FIG. 8A, will be effective to correct the side pin-suchion distortion of the raster.

Figure 9A:
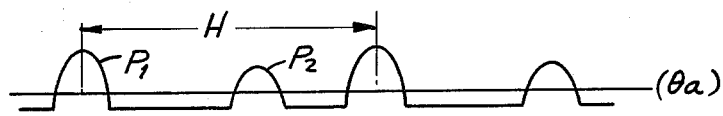
FIGS. 9A, 9B and 9C are waveform diagrams showing voltage pulses appearing across the primary winding of a fly-back transformer in the circuit of FIG. 2 for respective phase relationships of the switching signals.
Figure 9B:
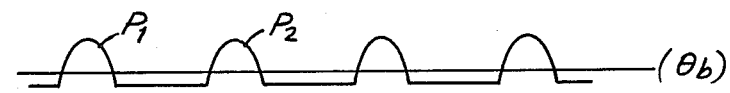
Figure 9C:
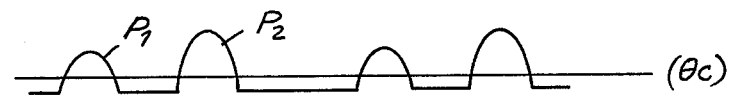

It will also be appreciated that the voltage pulses appearing across primary winding 16a of flyback transformer 16 are stepped up by the flyback transformer, and the resulting stepped-up voltage pulses appearing across secondary winding 16b are rectified by circuit 8 to provide a relatively high DC voltage at terminal 9 which may be supplied to the anode of a cathode ray tube (not shown). The waveforms of the voltage pulses appearing across primary winding 16a when the phase differences between switching signals $S_a$ and $S_b$ are $\theta_a$, $\theta_b$ and $\theta$ are shown on FIGS. 9A, 9B and 9C, respectively, and it will be appreciated that the voltage pulses appearing across secondary winding 16b have similar waveforms. It will be noted that the peak voltages of the voltage pulses obtained for the phase difference $\theta_a$ (FIG. 9A) or for the phase difference $\theta_c$ (FIG. 9C) are substantially different from the peak voltages of the pulses obtained for the phase difference $\theta_b$ (FIG. 9B). Since the rectifying circuit 8 is usually of the peak-rectifying type, a constant high DC voltage cannot be obtained from the flyback transformer 16 so long as the voltage pulses appearing across primary winding 16a have different peak voltages in response to the phase difference between switching signals $S_a$ and $S_b$ being varied between $\theta_a$ and $\theta_c$.

In accordance with this invention, a constant high DC voltage is obtainable from flyback transformer 16 of the horizontal deflection circuit shown on FIG. 2, by providing the switching circuit including the coil $L_2$ with a resonant frequency of its retrace period which is twice that of the switching circuit including the coil $L_1$, for example, by providing the capacitor 14b with a capacitance value which is one-half that of the capacitor 14a so that the pulse width of the pulse $P_2$ appearing across coil $L_2$ is one-half the pulse width of the pulse $P_1$ appearing across coil $L_1$. Further, in the preferred embodiment of this invention, the phase relationship of the switching signals $S_a$ and $S_b$ is selected so that, as the phase difference between the switching signals $S_a$ and $S_b$ is varied or modulated, each pulse $P_2$ appearing across the coil $L_2$ occurs during the time when a pulse $P_1$ is appearing across the coil $L_1$.

The operation of the above-described preferred embodiment of the invention will be explained below with reference to FIGS. 10–13. More particularly, FIGS. 10A and 10B respectively show the waveforms of switching signals $S_a$ and $S_b$ which have the same frequency, with the pulse width of switching signal $S_b$ being larger than the pulse width of switching signal $S_a$. At the trailing or down-going edges of switching signals $S_a$ and $S_b$, voltage pulses $P_1$ and $P_2$ (FIGS. 10C and 10D, respectively) are made to appear across coils $L_1$ and $L_2$. Since each voltage pulse $P_2$ has a pulse width which is about one-half the pulse width of the voltage pulse $P_1$, the amplitude of each pulse $P_2$ is shown to be about twice as large as the amplitude of each pulse $P_1$. The waveforms of the currents $I_{L1}$ and $I_{L2}$ flowing through coils $L_1$ and $L_2$ are shown on FIG. 10E to be made up of respective portions representing transistor currents $i_{T1}$ and $i_{T2}$, damper currents $i_{D1}$ and $i_{D2}$, and resonant currents $i_{P1}$ and $i_{P2}$.

Figure 10A:
FIGS. 10A-10H, FIGS. 11A-11E, and FIGS. 12A-12H are waveform diagrams to which reference will be made in explaining the operation of a control circuit according to a preferred embodiment of the invention.
Figure 10B:
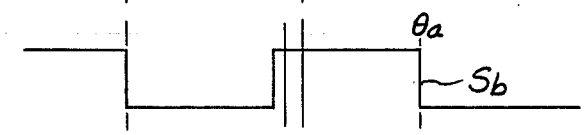
Figure 10C:
Figure 10D:
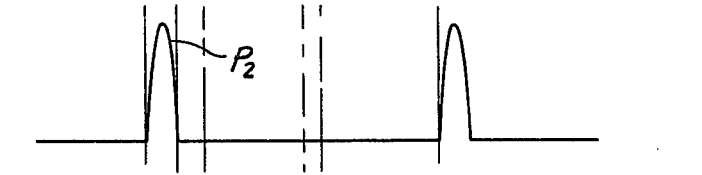
Figure 10E:
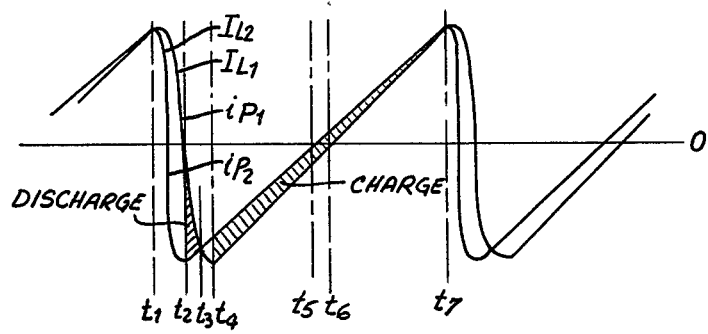
Figure 10F:
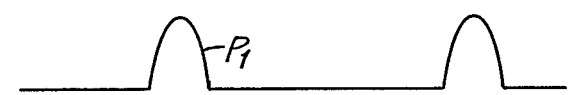
Figure 10G:
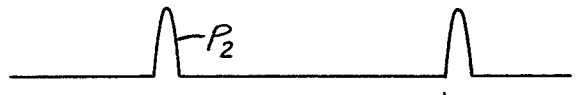
Figure 10H:
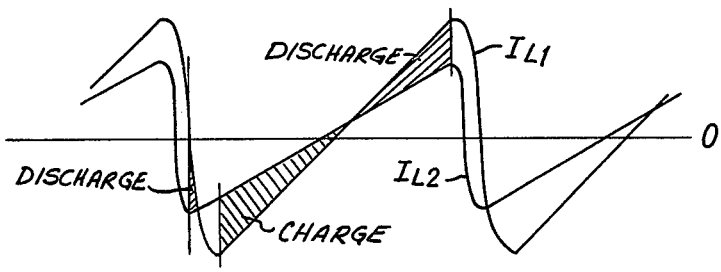

The charging and discharging of capacitor 11 by currents $I_{L1}$ and $I_{L2}$ shown on FIG. 10E will now be considered for a horizontal interval extending from the time $t_1$ to the time $t_7$. During the period $t_1$ to $t_2$, the currents $I_{L1}$ and $I_{L2}$ are constituted by resonant currents $i_{P1}$ and $i_{P2}$, respectively, so that capacitor 11 is neither charged nor discharged by such currents and the voltage across capacitor 11 remains unchanged. During the next period $t_2$ to $t_3$, the current $I_{L1}$ is still constituted by resonant current $i_{P1}$, and the current $I_{L2}$ is constituted by the damper current $i_{D2}$. The currents $i_{P1}$ and $i_{D2}$ flow in respect to capacitor 11 in the directions to charge and discharge, respectively, the latter. Since damper current $i_{D2}$ is shown on FIG. 10E to be larger than the resonant current $i_{P1}$ during the period $t_2$ to $t_3$, only the difference current $i_{D2} - i_{P1}$ flows through capacitor 11 in the direction to discharge the same. The voltage discharged from capacitor 11 by difference current $(i_{D2} - i_{P1})$ is proportional to the hatched area appearing on FIG. 10E between times $t_2$ and $t_3$. During the next period $t_3$ to $t_4$, currents $I_{L1}$ and $I_{L2}$ are again constituted by resonant current $i_{P1}$ and damper current $i_{D2}$, respectively. However, in such period $t_3$ to $t_4$, the current $i_{P1}$ is shown on FIG. 10E to be larger than the current $i_{D2}$ so that damper current $i_{D2}$ does not flow through capacitor 11 and only a part of the resonant current $i_{P1}$ (that is, $i_{P1} - i_{D2}$) flows through capacitor 11 which is not charged thereby so that the voltage across capacitor 11 is unchanged. During the next period $t_4$ to $t_5$, currents $I_{L1}$ and $I_{L2}$ are constituted by damper currents $i_{D1}$ and $i_{D2}$, respectively, which damper currents flow through capacitor 11 in the directions to charge the capacitor 11 and to discharge the capacitor 11, respectively. As shown on FIG. 10E, the damper current $i_{D1}$ is larger than the damper current $i_{D2}$ during the period $t_4$ to $t_5$, so that the difference current $(i_{D1} - i_{D2})$ flows through capacitor 11 in the direction to charge the same. The charged voltage, that is, the increase in the voltage across capacitor 11 in response to the difference current $(i_{D1} - i_{D2})$ is proportional to the hatched area appearing on FIG. 10E between the times $t_4$ and $t_5$. During the following period $t_5$ to $t_6$, the current $I_{L1}$ is again constituted by damper current $i_{D1}$ and the current $I_{L2}$ is constituted by transistor current $i_{T2}$. Both of the currents $i_{D1}$ and $i_{T2}$ flow through capacitor 11 in the direction to charge the same, and the charged voltage of capacitor 11 resulting from these currents is proportional to the hatched area shown on FIG. 10E between the times $t_5$ and $t_6$. During the last period $t_6$ to $t_7$ of a horizontal interval, currents $I_{L1}$ and $I_{L2}$ are constituted by transistor currents $i_{T1}$ and $i_{T2}$, respectively. The current $i_{T1}$ flows through capacitor 11 in the direction to discharge the latter, while the current $i_{T2}$ flows through capacitor 11 in the direction to charge the same. As shown on FIG. 10E, current $i_{T2}$ is larger than current $i_{T1}$, so that the difference current $(i_{T2} - i_{T1})$ flows through capacitor 11 in the direction to charge the latter, with the resulting charged voltage or voltage increase of capacitor 11 being proportional to the hatched area on FIG. 10E between the times $t_6$ and $t_7$.

As is apparent from FIG. 10E, in a horizontal interval considered as a whole, that is, in the interval between times $t_1$ and $t_7$, the charged voltage or aggregate voltage increase is larger than the discharged voltage or aggregate voltage decrease so that the voltage across capacitor 11 increases from the initial voltage E/2. The increased voltage across capacitor 11 causes the current $I_{L1}$ to increase and current $I_{L2}$ to decrease, as shown on FIG. 10H, with the result that, in each horizontal interval, the charged and discharged voltages in capacitor 11 will be made to be equal to each other. Furthermore, the increase of current $I_{L1}$ and the decrease of the current $I_{L2}$ causes the amplitudes of the pulses $P_1$ and $P_2$ (FIGS. 10F and 10G) appearing across the coils $L_1$ and $L_2$ to respectively increase and decrease from the initial amplitudes of such pulses shown on FIGS. 10C and 10D, respectively.

In the above description of the preferred embodiment of the invention with reference to FIGS. 10A–10H, switching signals $S_a$ and $S_b$ have had the phase relationship $\theta_a$ in which the trailing or down-going edges of both switching signals substantially coincide so that the voltage pulse $P_2$ of relatively small width (FIG. 10D) occurs substantially during the first half of the corresponding voltage pulse $P_1$ (FIG. 10C).

Figure 11A:
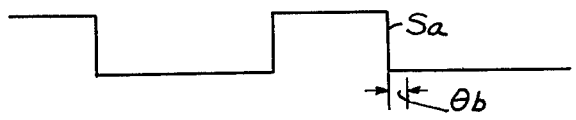
Figure 11B:
Figure 11C:
Figure 11D:
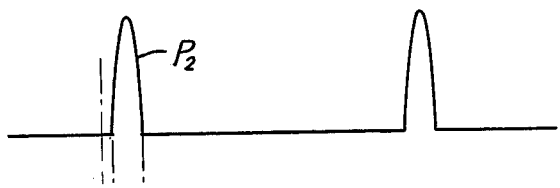
Figure 11E:
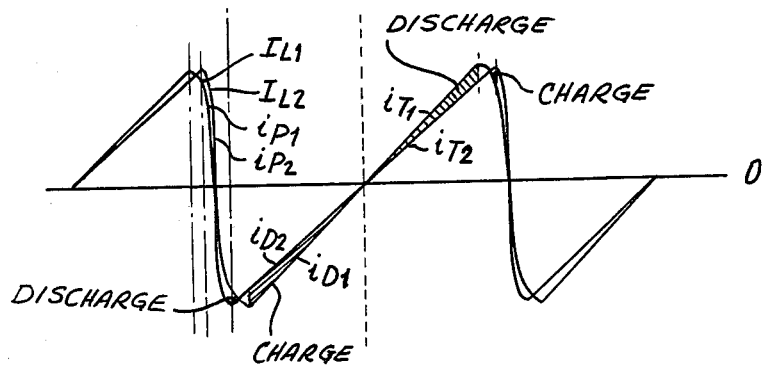

When switching signals $S_a$ and $S_b$ have the phase relationship $\theta_b$ shown on FIGS. 11A and 11B so that each relatively narrow voltage pulse $P_2$ appears across coil $L_2$ approximately at the center of a respective voltage pulse $P_1$ appearing across coil $L_1$, as shown on FIGS. 11C and 11D, the waveforms of currents $I_{L1}$ and $I_{L2}$ flowing through coils L and $L_2$ are as shown on FIG. 11E. It will be seen from FIG. 11E that the charged and discharged voltages of capacitor 11 by reason of the currents $I_{L1}$ and $I_{L2}$ are equal for each horizontal interval and, therefore, the voltage across capacitor 11 remains unchanged at E/2. By reason of the foregoing, the amplitudes of currents $I_{L1}$ and $I_{L2}$ and of voltage pulses $P_1$ and $P_2$ are unchanged and maintained at their initial values.

Figure 12A:
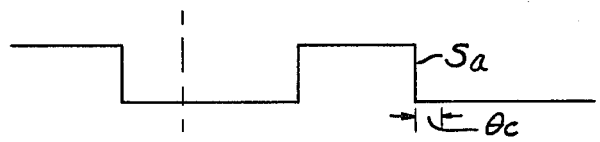
Figure 12B:
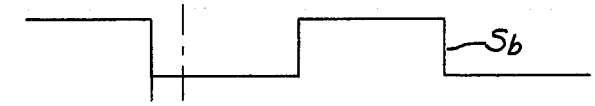
Figure 12C:
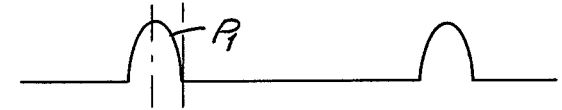
Figure 12D:
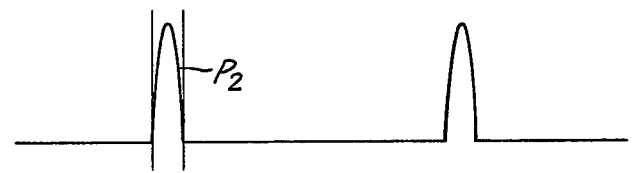
Figure 12E:
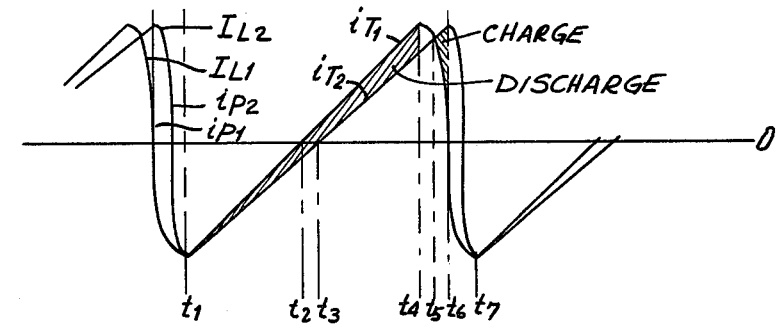
Figure 12F:
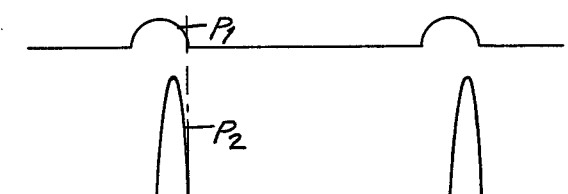
Figure 12G:
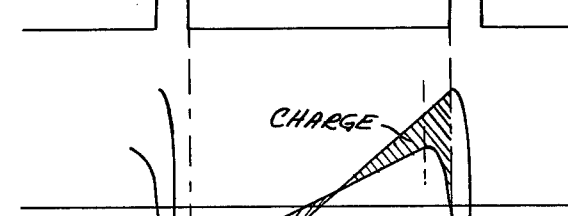
Figure 12H:

When the phase relationship between switching signals $S_a$ and $S_b$ is as shown on FIGS. 12A and 12B, that is, with a phase difference $\theta_c$ therebetween so that each voltage pulse $P_2$ appears during the second half of the respective voltage pulse $P_1$, as shown on FIGS. 12C and 12D, the currents $I_{L1}$ and $I_{L2}$ flowing through coils $L_1$ and $L_2$, respectively, have the waveforms shown on FIG. 12E. As is clear from FIG. 12E, during each horizontal interval, the voltage discharged from capacitor 11 by reason of currents $I_{L1}$ and $I_{L2}$ is larger than the charged voltage due to such currents. Therefore, the voltage across capacitor 11 decreases from the initial voltage E/2. Because of the decrease in the voltage across capacitor 11, the amplitude of current $I_{L1}$ flowing through coil $L_1$ decreases and the amplitude of the current $I_{L2}$ flowing through coil $L_2$ correspondingly increases, as shown on FIG. 12H, so that the charged voltage and the discharged voltage of capacitor 11 resulting from the adjusted currents $I_{L1}$ and $I_{L2}$ are made to be equal. Simultaneously, the amplitude of each voltage pulse $P_1$ is decreased and the amplitude of each voltage pulse $P_2$ is increased from the initial amplitudes, as shown on FIGS. 12F and 12G.

It will be apparent from the above that, by varying the phase difference between switching signals $S_a$ and $S_b$, for example, from the value $\theta_a$ (FIGS. 10A and 10B) to the value $\theta_c$ (FIGS. 12A and 12B), the voltage $E_o$ across capacitor 11 can be varied along the line 23 on FIG. 13. Thus, the voltage $E_o$ across capacitor 11 can be modulated parabolically at the vertical deflection rate if the phase difference between switching signals $S_a$ and $S_b$ is modulated by the correcting signal $S_p$. The amplitude of the current $I_{L1}$ flowing through the horizontal deflection coil $L_1$ varies in correspondence with the voltage $E_o$ across capacitor 11 so that the current $I_{L1}$ is modulated parabolically at the vertical deflection rate in response to the modulation of the phase difference between switching signals $S_a$ and $S_b$ by the correcting signal $S_p$. Thus, the preferred embodiment of the invention described above with reference to FIGS. 10A–10H, 11A–11E and 12A–12H is also effective to correct the side pin-cushion distortion of the raster.

Moreover, by reason of the fact that, in the preferred embodiment, each voltage pulse $P_2$ at all times occurs during the occurrence of a respective voltage pulse $P_1$ as the phase difference between switching signals $S_a$ and $S_b$ is modulated, the stepped-up voltage pulses appearing across the secondary winding 16b of flyback transformer 16 can be rectified to provide a constant high voltage which, for example, can be applied to the anode of the cathode ray tube. In connection with the foregoing, it will be apparent that, since primary winding 16a of flyback transformer 16 is connected in parallel with the series connection of coils $L_1$ and $L_2$, the pulse voltage across primary winding 16a is the sum of the voltages of the pulses $P_1$ and $P_2$. Although modulation of the phase difference of switching signals $S_a$ and $S_b$ for modulating the current $I_{L1}$ flowing through the horizontal deflection coil $L_1$ also causes modulation of the amplitudes of voltage pulses $P_1$ and $P_2$, reference to FIGS. 10C, 10D, 10F, 10G, 11C, 11D, 12C, 12D, 12F and 12G will show that, when the amplitude of one of the pulses $P_1$ and $P_2$ is decreased, the amplitude of the other of such pulses $P_1$ and $P_2$ is increased. Thus, by relatively timing the pulses $P_1$ and $P_2$ so that each pulse $P_2$ always occurs during the occurrence of a respective pulse $P_1$, the amplitude of the added pulse voltage, that is, the sum of the amplitudes of the pulses $P_1$ and $P_2$, will be substantially constant. Accordingly, even if the phase relation of switching signals $S_a$ and $S_b$ is modulated by the correcting pulse $S_p$ to correct the side pin-cushion distortion of the raster, the pulse voltage across winding 16a remains constant and a substantially constant high voltage can be obtained from the secondary winding 16b of the flyback transformer in the above-described preferred embodiment of the invention.

In the preferred embodiment of the invention, as explained above with reference to FIGS. 10A and 10B, 11A and 11B, and 12A and 12B, the switching signal $S_b$ for the switching transistor $Q_2$ has been assumed to have a constant pulse width greater than the constant pulse width of the other switching signal $S_a$, and only the phase relation between the switching signals $S_a$ and $S_b$ has been modulated. However, the circuit according to the invention essentially responds only to the relative timing or phase relation of the trailing or down-going edges of switching signals $S_a$ and $S_b$. Thus, if desired, in a circuit according to the present invention, the rising edge of each pulse of switching signal $S_b$ can be fixed to coincide, in time, with the rising edge of a corresponding pulse of switching signal $S_a$, and the pulse width of switching signal $S_b$ can be varied to provide corresponding modulation of the phase relation of the trailing edge of each pulse of switching signal $S_b$ in respect to the trailing edge of the corresponding pulse of switching signal $S_a$, thereby to achieve corresponding modulation of the horizontal deflection current $I_{L1}$, as previously described.

Figure 14:
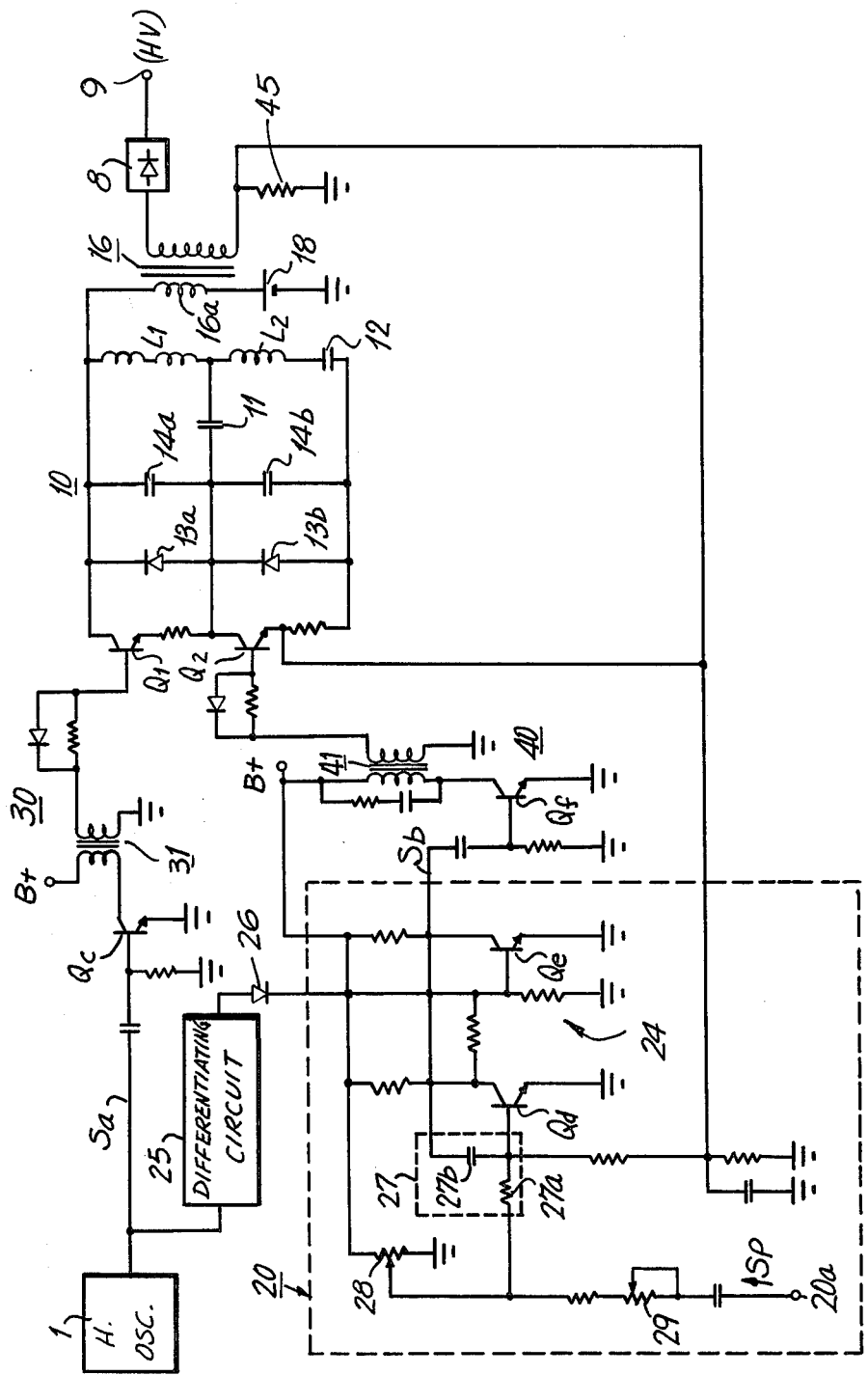
FIG. 14 is a more detailed circuit diagram of another embodiment of this invention.

Referring now to FIG. 14, it will be seen that the previously described pin-cushion distortion correcting circuit 10 according to this invention is there shown associated with cooperating components which are disclosed in greater detail than in FIG. 2. More particularly, a horizontal drive circuit 30 is shown on FIG. 14 to include a drive transistor $Q_c$ which, at its base, receives signal $S_a$ from oscillator 1. The emitter of transistor $Q_c$ is connected to ground and the collector thereof is connected to a voltage source B+ through the primary winding of a drive transformer 31 which has its secondary winding suitably connected to the base of transistor $Q_1$ in circuit 10.

Further, in FIG. 14, the phase modulation circuit 20 is shown to include a monostable multivibrator 24 formed of a pair of transistors $Q_d$ and $Q_e$. The switching signal $S_a$ from oscillator 1 is differentiated by a differentiating circuit 25 and only the positive differentiated pulse is passed from the latter through a diode 26 to form a trigger signal applied to the base of transistor $Q_e$ and which corresponds to the rising edge of switching signal $S_a$. The unstable time constant of monostable multivibrator 24 is mainly determined by a time constant circuit 27 including a resistor 27a and capacitor 27b, and such unstable time of monostable multivibrator 24 can be changed by varying the voltage across resistor 27a. Thus, the pulse width of the switching signal $S_b$, which is obtained as the output from monostable multivibrator 24, can be changed by controlling or varying the voltage supplied to the time constant circuit 27. The circuit 20 is further shown to include a variable resistor 28 for adjusting the horizontal size of the raster, and a variable resistor 29 through which the parabolic signal $S_p$ is applied from an input terminal 20a so that the level of the side pin-cushion distortion correction can be varied by adjusting resistor 29.

The switching signal $S_b$ from circuit 20 is shown to be applied to the base of transistor $Q_2$ through a drive circuit 40 which includes a drive transistor $Q_f$ and a drive transformer 41.

As is well-known, when the amplitude of the luminance component of a video signal is changed, for example, in accordance with a change in the brightness of the displayed picture, there is a corresponding change in the beam current in the cathode ray tube. A change in the beam current causes a respective change in the anode voltage of the tube, for example, an increase in the beam current causes a decrease in the anode voltage which, in turn, results in an increase in the size of the raster in both the horizontal and vertical directions.

In the embodiment of the present invention illustrated on FIG. 14, in order to keep constant the size of the raster in the horizontal direction notwithstanding changes in the beam current and, hence, in the anode voltage, a resistor 45 is connected between ground and the cold end of secondary winding 16b of flyback transformer 16. Therefore, a change in the beam current and, hence, in the anode voltage derived from terminal 9, is detected as a change in the voltage across resistor 45. The detected voltage across resistor 45 controls the voltage supplied to time constant circuit 27 so as to correspondingly control the unstable time of the monostable multivibrator 24. In controlling the unstable time of monostable multivibrator 24, the pulse width of switching signal $S_b$ obtained as the output therefrom is controlled to modulate the horizontal deflection current $I_{L1}$ in the sense to maintain constant the size of the raster in the horizontal direction.

It will also be seen from FIG. 14 that the emitter of transistor $Q_2$ is connected to the base of transistor $Q_d$ in monostable multivibrator 24 for protection from arc discharge in the cathode ray tube. By reason of the closed loop furnished by the connection from the emitter of transistor $Q_2$ to the base of transistor $Q_d$, an excessive current flowing through transistor $Q_2$ due to an arc discharge in the cathode ray tube is detected and the pulse width of switching signal $S_b$, and hence the phase relation between switching signals $S_a$ and $S_b$, is instantly controlled in the sense to protect the active element in the circuit.

In the embodiment of the invention shown on FIG. 14, the resistor 45 connected to the secondary winding of flyback transformer 16 is employed for detecting changes in the beam current in connection with stabilizing the size of the raster, but it will be appreciated that the change in the high or anode voltage obtained at terminal 9 can also be detected by means of a tertiary winding (not shown) on transformer 16.

Figure 15:
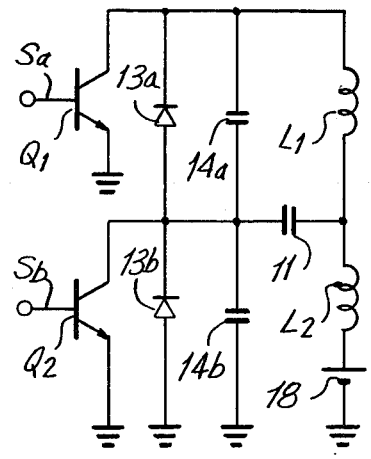
FIGS. 15 and 16 are equivalent circuit diagrams similar to that of FIG. 3B, but illustrating additional embodiments of the invention.

In the previously described embodiments of the invention, the emitter of switching transistor $Q_1$ has been connected directly to the collector of switching transistor $Q_2$, for example, as shown on FIG. 2. However, as shown on FIG. 15, in accordance with another embodiment of the invention, the emitter of transistor $Q_1$ may be connected to ground.

Figure 16:
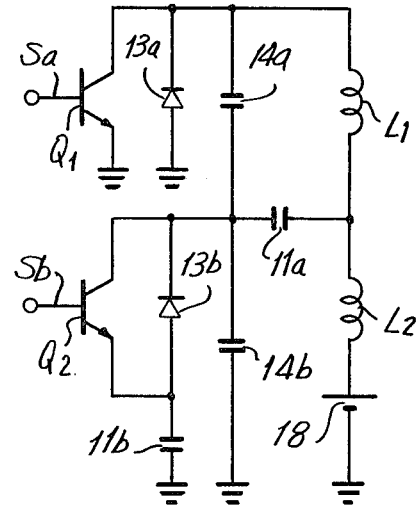

In accordance with still another embodiment of the invention, as shown on FIG. 16, the emitter of switching transistor $Q_1$ is again connected to ground, the damper diode 13a is connected in parallel with the collector-emitter circuit of transistor $Q_1$, and the single charging capacitor 11 of the earlier-described embodiments is replaced by two capacitors 11a and 11b interposed in the current path of transistors $Q_1$ and $Q_2$. More particularly, as shown, capacitor 11a is connected between a connection point of coil $L_1$ with coil $L_2$ and a connection point of capacitor 14a with capacitor 14b, and capacitor 11b is connected between the emitter of transistor $Q_2$ and ground.

Figure 17:
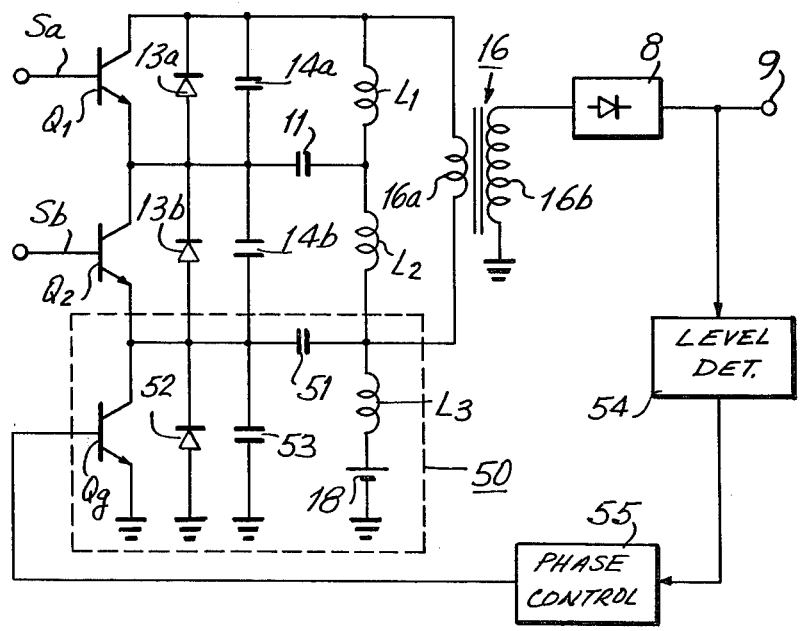
FIG. 17 is a circuit diagram illustrating still another embodiment of the invention in which the supply voltage is stabilized.

Referring now to FIG. 17, it will be seen that, in accordance with still another embodiment of the invention, a switching circuit similar to that shown on FIG. 2 may be further provided with a circuit 50 for stabilizing a supply voltage from source 18. More particularly, the stabilizing circuit 50 is shown to include a switching transistor $Q_g$ having its collector connected to the emitter of transistor $Q_2$ and its emitter connected to ground, a damper diode 52 and a resonant capacitor 53 connected in parallel with the collector-emitter circuit of transistor $Q_g$, a charge capacitor 51 connected between the collector of transistor $Q_g$ and a connection point of coil $L_2$ with an additional coil $L_3$ which is in series with coils $L_1$ and $L_2$ and the voltage source 18. Any fluctuations in the high voltage obtained from rectifying circuit 8 due to fluctuations in the voltage from source 18 are detected by a level detector 54 and the resulting output from the latter acts in a phase control circuit 55 to provide a control voltage to the base of transistor $Q_g$ by which the voltage across capacitor 51 is stabilized.

It will be appreciated that, with all of the above described embodiments of the invention, the so-called side pin-cushion distortion of the raster can be corrected by means of a relatively simple arrangement, and further that, with the embodiment of FIG. 14, the size of the raster in the horizontal direction can be stabilized regardless of changes in the anode voltage. Further, the foregoing objects can be realized with a minimized power consumption or loss by reason of the fact that transistors $Q_1$ and $Q_2$ act as switching elements rather than as variable impedance elements. Moreover, a substantially linear relationship is maintained between the modulation of the phase relationship of switching signals $S_a$ and $S_b$ by correcting signal $S_p$ and the resulting change in the horizontal deflection current $I_{L1}$.

Although illustrative embodiments of the invention have been described in detail herein with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A current control circuit comprising:
    first and second switching circuits;
    a first resonant circuit connected in parallel with said first switching circuit and including a first coil and a first capacitor;
    a second resonant circuit connected in parallel with said second switching circuit and including a second coil and a second capacitor;
    means defining a common current path for currents flowing through said first and second coils, respectively, and including a charging capacitor interposed in said path;
    means for applying first and second switching signals of the same frequency to said first and second switching circuits, respectively; and
    means for varying the phase relation of said first and second switching signals at a second frequency different from the first-mentioned frequency and thereby controlling the voltage across said charging capacitor and, accordingly, a current flowing through one of said first and second coils.

2. A current control circuit according to claim 1; wherein each of said first and second switching circuits includes a switching transistor and a damper diode connected in parallel with each other, and said first and second switching signals are applied to the switching transistors of said first and second switching circuits, respectively.

3. A current control circuit according to claim 2; wherein said means for applying the first and second switching signals includes an oscillator for generating an output with said frequency and which is applied as said first switching signal to the transistor of said first switching circuit, and said means for varying the phase relation of said first and second switching signals includes phase control means receiving said output of the oscillator and providing a phase controlled output which is applied as said second switching signal to the transistor of said second switching circuit.

4. A current control circuit according to claim 3; wherein said phase control means is a phase modulator receiving said output of the oscillator and a control signal by which the oscillator output is phase modulated.

5. A current control circuit comprising:
    first and second switching circuits;
    a first resonant circuit connected in parallel with said first switching circuit and including a first coil and a first capacitor;
    a second resonant circuit connected in parallel with said second switching circuit and including a second coil and a second capacitor;
    means defining a common current path for currents flowing through said first and second coils, respectively, and including a charging capacitor interposed in said path;
    means for applying first and second switching signals of the same frequency to said first and second switching circuits, respectively;
    means for varying the phase relation of said first and second switching signals and thereby controlling the voltage across said charging capacitor and, accordingly, a current flowing through one of said first and second coils;
    each of said first and second switching circuits including a switching transistor and a damper diode connected in parallel with each other; said first and second switching signals being applied to the switching transistors of said first and second switching circuits, respectively;
    said means for applying the first and second switching signals including an oscillator for generating an output with said frequency and being applied as said first switching signal to the transistor of said first switching circuit;
    said means for varying the phase relation of said first and second switching signals including phase control means receiving said output of the oscillator and providing a phase controlled output which is applied as said second switching signal to the transistor of said second switching circuit; and
    said phase control means including a monostable multivibrator and means for controlling the unstable time of said monostable multivibrator.

6. A current control circuit according to claim 1; wherein said means for applying the first and second switching signals includes an oscillator for generating an output with said frequency and which is applied as said first switching signal to said first switching circuit, and said means for varying the phase relation of said first and second switching signals includes phase control means receiving said output of the oscillator and providing a phase controlled output which is applied as said second switching signal to said second switching circuit.

7. A current control circuit comprising:
    first and second switching circuits;
    a first resonant circuit connected in parallel with said first switching circuit and including a first coil and a first capacitor;
    a second resonant circuit connected in parallel with said second switching circuit and including a second coil and a second capacitor;
    means defining a common current path for currents flowing through said first and second coils, respectively, and including a charging capacitor interposed in said path;
    means for applying first and second switching signals of the same frequency to said first and second switching circuits, respectively, including an oscillator for generating an output with said frequency and which is applied as said first switching signal to said first switching circuit;
    means for varying the phase relation of said first and second switching signals and thereby controlling the voltage across said charging capacitor and, accordingly, a current flowing through one of said first and second coils, including phase control means receiving said output of the oscillator and providing a phase controlled output which is applied as said second switching signal to said second switching circuit; and
    said phase control means including a monostable multivibrator and means for controlling the unstable time of said monostable multivibrator.

8. A current control circuit according to claim 1; in which said first and second coils are connected in series, and said common current path with said charging capacitor interposed therein extends from a connection point between said coils.

9. A current control circuit according to claim 8; in which said first switching circuit includes a first switching transistor controllable by said first switching signal and a first damper diode connected in parallel with said first switching transistor, and said second switching circuit includes a second switching transistor controllable by said second switching signal and a second damper diode in parallel with said second switching transistor.

10. A current control circuit according to claim 9; in which said first and second switching transistors have respective collector-emitter paths connected in series with each other, said first and second damper diodes are connected in series with each other, and said first and second capacitors are connected in series with each other.

11. A current control circuit according to claim 9; in which said first and second switching transistors have respective collector-emitter paths connected to ground, said first and second damper diodes are connected in series with each other, and said first and second capacitors are connected in series with each other.

12. A current control circuit according to claim 9; in which said first switching transistor has a collector-emitter path connected to ground, said first and second capacitors are connected in series, and an additional charging capacitor is connected between the parallel connection of said second switching transistor and second damper diode and ground.

13. A current control circuit comprising:
first and second switching circuits;
a first resonant circuit connected in parallel with said first switching circuit and including a first coil and a first capacitor;
a second resonant circuit connected in parallel with said second switching circuit and including a second coil and a second capacitor;
means defining a common current path for currents flowing through said first and second coils, respectively, and including a charging capacitor interposed in said path;
means for applying first and second switching signals of the same frequency to said first and second switching circuits, respectively;
means for varying the phase relation of said first and second switching signals and thereby controlling the voltage across said charging capacitor and, accordingly, a current flowing through one of said first and second coils; and
said one of said first and second coils being a horizontal deflection coil of a television receiver, said frequency of the switching signal being the horizontal frequency of a video signal, and the phase relation of said first and second switching signals being varied parabolically with a repetition rate equal to the vertical frequency of said video signal so as to correct a side pincushion distortion of the raster of said television receiver.

14. A current control circuit according to claim 13; further comprising a flyback transformer having a primary winding connected with said first and second coils so that currents flowing through the latter produce corresponding voltage pulses across said primary winding and a secondary winding at which stepped-up voltage pulses are obtained, and rectifying means for obtaining a relatively high DC voltage from said stepped-up voltage pulses.

15. A current control circuit according to claim 14; in which said second capacitor has a capacitance value substantially less than the capacitance value of said first capacitor so that pulses appearing across said second coil will have a width substantially smaller than the width of pulses appearing across said first coil; and in which variation of said phase relation of the first and second switching signals is limited to cause each of said pulses appearing across said second coil to occur during the occurrence of a respective pulse across said first coil for ensuring that said high DC voltage will be substantially constant.

16. A current control circuit according to claim 14; further comprising a power supply source connected with said coils and being susceptible to voltage changes, level detecting means responsive to said high DC voltage from the rectifier means for indicating voltage changes of said power supply source, and means controlled by said level detecting means for stabilizing the voltage applied from said power supply source to said coils.

17. A current control circuit according to claim 14; in which said relatively high DC voltage is employed as the anode voltage in the television receiver, detecting means detects changes in said anode voltage, and the phase relation of said first and second switching signals is controlled in response to detected changes in the anode voltage so as to tend to maintain substantially constant the horizontal dimension of said raster.

18. In a horizontal deflection circuit of a television receiver having a horizontal deflection coil for horizontally deflecting an electron beam in response to a current flow through said coil; a side pin-cushion distortion correcting circuit comprising:
first and second switching circuits;
a first resonant circuit connected in parallel with said first switching circuit and including said horizontal deflection coil and a first capacitor;
a second resonant circuit connected in parallel with said second switching circuit and including a second coil and a second capacitor;
means defining a common current path for currents flowing through said horizontal deflection and second coils, respectively, and including a charging capacitor interposed in said path;
means for applying first and second switching signals at the horizontal frequency of a video signal to said first and second switching circuits, respectively; and
means for parabolically varying the phase relation of said first and second switching signals with a repetition rate equal to the vertical frequency of said video signal and the reby controlling the voltage across said charging capacitor and, accordingly, a current flowing through said horizontal deflection coil so as to correct side pin-cushion distortion of the electron beam raster.

19. A horizontal deflection circuit according to claim 18; wherein each of said first and second switching circuits includes a switching transistor and a damper diode connected in parallel with each other, and said first and second switching signals are applied to the switching transistors of said first and second switching circuits, respectively.

20. A horizontal deflection circuit according to claim 18; further comprising a flyback transformer having a primary winding connected with said horizontal deflection and second coils so that currents flowing through the latter produce corresponding voltage pulses across said primary winding and a secondary winding at which stepped-up voltage pulses are obtained, rectifying means for obtaining a relatively high DC voltage from said stepped-up voltage pulses to be employed as an anode voltage in the television receiver, detecting means for detecting changes in said anode voltage with changes in picture brightness, and means for controlling said phase relation of said first and second switching signals in response to detected changes in said anode voltage so as to tend to stabilize the horizontal size of said raster.

21. In a television receiver having a cathode ray tube to which an anode voltage is applied and in which the size of the raster is varied with changes in said anode voltage upon variation of picture brightness; a circuit for stabilizing the raster size in the horizontal direction comprising a horizontal deflection coil through which a current is made to flow for horizontally deflecting an electron beam in said cathode ray tube, first and second switching circuits, a first resonant circuit connected in parallel with said first switching circuit and including said horizontal deflection coil and a first capacitor, a second resonant circuit connected in parallel with said second switching circuit and including a second coil and a second capacitor, means defining a common current path for currents flowing through said horizontal deflection and second coils, respectively, and including a charging capacitor interposed in said path, means for applying first and second switching signals of the horizontal frequency of a video signal to said first and second switching circuits, respectively, control means for varying the phase relation of said first and second switching signals and thereby controlling the voltage across said charging capacitor and, accordingly, the current flowing through said horizontal deflection coil, a flyback transformer having a primary winding connected with said coils so that currents flowing through the latter produce corresponding voltage pulses across said primary winding and a secondary winding at which stepped-up voltage pulses are obtained, rectifying means for obtaining a relatively high DC voltage from said stepped-up voltage pulses and which is employed as the anode voltage for the cathode ray tube, detecting means for detecting changes in said anode voltage with changes in picture brightness, and means for causing said control means to vary said phase relation of the first and second switching signals in response to detected changes in said anode voltage so as to stabilize the horizontal size of said raster.

22. A television receiver according to claim 21; in which said second capacitor has a capacitance value substantially less than the capacitance value of said first capacitor so that pulses appearing across said second coil will have a width substantially smaller than the width of pulses appearing across said horizontal deflection coil; and in which variation of said phase relation of the first and second switching signals is limited to cause each of said pulses appearing across said second coil to occur during the occurrence of a respective pulse across said horizontal deflection coil for ensuring that said high DC voltage will be substantially constant.

23. A television receiver according to claim 21; in which said means for applying the first and second switching signals includes an oscillator for generating an output with said horizontal frequency and which is applied as said first switching signal to said first switching circuit, said control means for varying the phase relation of said first and second switching signals incudes a monostable multivibrator receiving said output of the oscillator and means for controlling the unstable time of said multivibrator for providing a phase controlled output which is applied as said second switching signal to said second switching circuit.

* * * * *